(12) United States Patent
Greverie et al.

(10) Patent No.: US 7,076,218 B2
(45) Date of Patent: Jul. 11, 2006

(54) CONTROL METHOD AND CIRCUIT FOR USING A HETEROJUNCTION BIPOLAR TRANSISTOR POWER AMPLIFIER IN A ZERO INTERMEDIATE FREQUENCY ARCHITECTURE TRANSMITTER

(75) Inventors: Franck Greverie, Paris (FR); Luc Renard-Darvil, Sannois (FR)

(73) Assignee: TCL Communication Technology Holdings Limited, Hong Kong (CN)

( * ) Notice: Subject to any disclaimer, the term of this patent is extended or adjusted under 35 U.S.C. 154(b) by 950 days.

(21) Appl. No.: 09/941,745

(22) Filed: Aug. 30, 2001

(65) Prior Publication Data
US 2002/0028664 A1 Mar. 7, 2002

(30) Foreign Application Priority Data
Aug. 31, 2000 (FR) ................................ 00 11117

(51) Int. Cl.
*H01Q 11/12* (2006.01)
(52) U.S. Cl. .................. 455/127.1; 455/91; 455/127.2; 455/127.5
(58) Field of Classification Search .............. 455/91, 455/127.1, 127.2, 127.5
See application file for complete search history.

(56) References Cited

U.S. PATENT DOCUMENTS

| 5,446,463 A | * | 8/1995 | Beaucourt et al. .......... 342/198 |
| 5,878,332 A | | 3/1999 | Wang et al. |
| 6,230,001 B1 | * | 5/2001 | Wyse ......................... 455/326 |
| 6,337,974 B1 | * | 1/2002 | Inamori et al. ............. 455/126 |

FOREIGN PATENT DOCUMENTS

| EP | 0 546 693 | 6/1993 |
| EP | 0 645 899 | 3/1995 |
| EP | 1 014 570 | 6/2000 |
| WO | WO 99 17444 | 4/1999 |

* cited by examiner

Primary Examiner—Duc Nguyen
Assistant Examiner—Matthew Genack
(74) Attorney, Agent, or Firm—Sughrue Mion, PLLC

(57) ABSTRACT

A method of controlling the power delivered by a heterojunction bipolar transistor power amplifier receiving an input power and delivering an amplified output power in a zero intermediate frequency architecture includes a step of detecting the output power and varying a control voltage of the power amplifier by means of a control loop and a step of varying the input power level of the power amplifier.

5 Claims, 1 Drawing Sheet

CONTROL METHOD AND CIRCUIT FOR USING A HETEROJUNCTION BIPOLAR TRANSISTOR POWER AMPLIFIER IN A ZERO INTERMEDIATE FREQUENCY ARCHITECTURE TRANSMITTER

CROSS-REFERENCE TO RELATED APPLICATIONS

This application is based on French Patent Application No. 00 11 117 filed Aug. 31, 2000, the disclosure of which is hereby incorporated by reference thereto in its entirety, and the priority of which is hereby claimed under 35 U.S.C. §119.

BACKGROUND OF THE INVENTION

1. Field of the Invention

The present invention relates to controlling the amplification of signals transmitted by mobile radiocommunication terminals, especially when using heterojunction bipolar transistor power amplifiers.

2. Description of the Prior Art

To provide sufficient power during the sending phase, the signal sent by a terminal such a mobile telephone must be amplified.

To this end terminals include a power amplifier receiving an input power and delivering an amplified output power, the amplification depending on a control voltage fed to the amplifier.

Some power amplifiers using the heterojunction bipolar transistor (HBT) technology are more efficient and much smaller than power amplifiers using other technologies.

In some cases the transmission architecture adopted by mobile terminal manufacturers is a zero intermediate frequency architecture. In this type of architecture, which reduces cost and size, the amplitude conversion related to amplification (referred to as AM/AM conversion) is a very important parameter. Spectrum degradation associated with AM/AM conversion is critical in a zero intermediate frequency architecture.

The degradation is very high at low amplifier output powers in a power amplifier using heterojunction bipolar transistors because the amplifier receives high input powers.

This being so, an object of the present invention is to palliate these drawbacks by proposing a method and a circuit enabling use of a power amplifier using heterojunction bipolar transistors in a zero intermediate frequency transmission architecture that reduces observable spectrum degradation.

SUMMARY OF THE INVENTION

To this end, the invention provides a method of controlling the power delivered by a heterojunction bipolar transistor power amplifier receiving an input power and delivering an amplified output power in a zero intermediate frequency architecture, the method including a step of detecting the output power and varying a control voltage of the power amplifier by means of a control loop and a step of varying the input power level of the power amplifier.

In an advantageous embodiment the input power is reduced if the output power is less than a predetermined limit value.

The invention also provides a circuit for controlling the power emitted by a heterojunction bipolar transistor power amplifier receiving an input power and delivering an amplified output power in a zero intermediate frequency architecture, the circuit including means for detecting the output power and varying a control voltage of the power amplifier and means for varying the input power of the power amplifier.

The means for varying the input power of the power amplifier are preferably adapted to reduce it if the output power is below a predetermined limit value.

The means for varying the input power of the power amplifier advantageously include a variable attenuator.

In one particular embodiment the control circuit includes a variable gain pre-amplifier.

The invention further provides a radiocommunication terminal including a power control circuit according to the invention.

The invention will be better understood in the light of the following description, which relates to an illustrative and non-limiting embodiment of the invention and is given with reference to the appended drawings.

DETAILED DESCRIPTION OF THE PREFERRED EMBODIMENT

Figure 1:
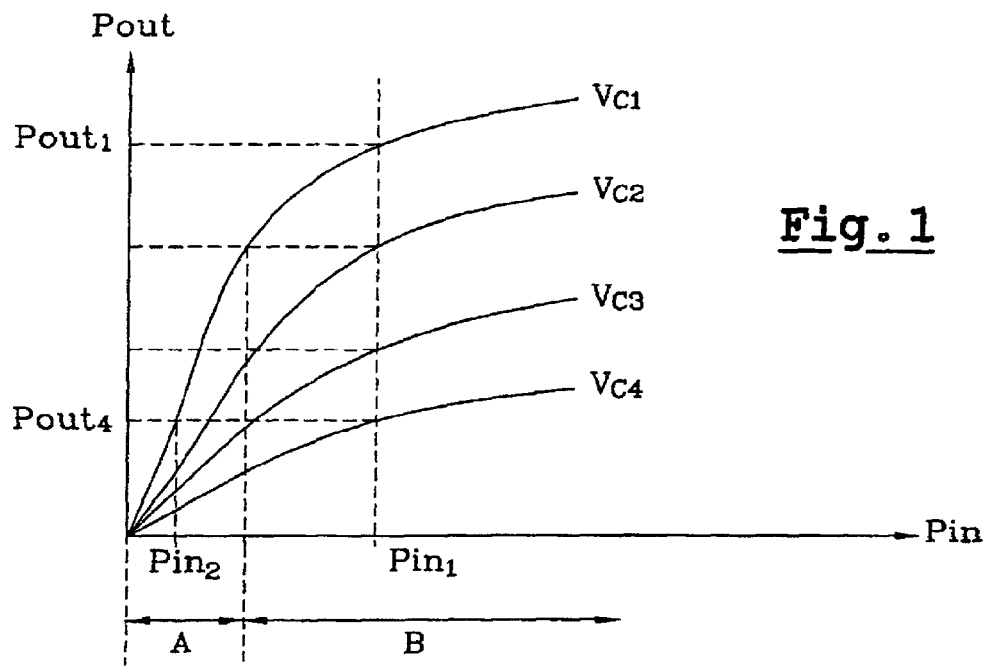
FIG. 1 is a diagram showing the evolution of the output power of a power amplifier as a function of the input power.

FIG. 1 is a diagram representing the output power Pout of a power amplifier as a function of its input power Pin.

The FIG. 1 diagram shows various curves corresponding to the evolution (gain) of the of the output power Pout as a function of the input power Pin for various values of the control voltage $V_C$ ($V_{C1}$ through $V_{C4}$, in decreasing order) fed to the power amplifier.

The output power Pout of a power amplifier is varied by varying the control voltage $V_C$ at constant input power Pin.

In the case of mobile radiocommunication terminals, for example, a power pre-amplifier provides a constant input power Pin to a power amplifier delivering an output power Pout. The level of the output power Pout is therefore varied by means of the control voltage $V_C$ at constant input power Pin.

The FIG. 1 diagram shows a first area A corresponding to linear operation of the power amplifier and a second area B corresponding to non-linear operation of the power amplifier.

The working area routinely used in the field of mobile radiocommunications is located around the input power $Pin_1$ shown in FIG. 1. The optimal efficiency of the power amplifier is obtained in this area, where its operation is non-linear.

However, with this method of varying the output power Pout, by varying the control voltage $V_C$, AM/AM conversion is degraded if the control voltage $V_C$ is reduced to obtain a lower output power Pout.

In this case the method according to the invention modifies the input power Pin if the necessary output power Pout becomes too low.

If the output power Pout required for correct operation of the terminal is reduced, the control voltage $V_C$ falls to the extent that AM/AM conversion, an important parameter in zero intermediate frequency architectures, is degraded excessively.

Shifting the input power Pin from the value $Pin_1$ to the lower constant value $Pin_2$ for the same output power $Pout_4$ changes the control voltage $V_C$ from the value $V_{C4}$ to the significantly higher value $V_{C1}$. The power amplifier then operates in linear mode, which, given the low output power level, does not compromise efficiency.

Figure 2:
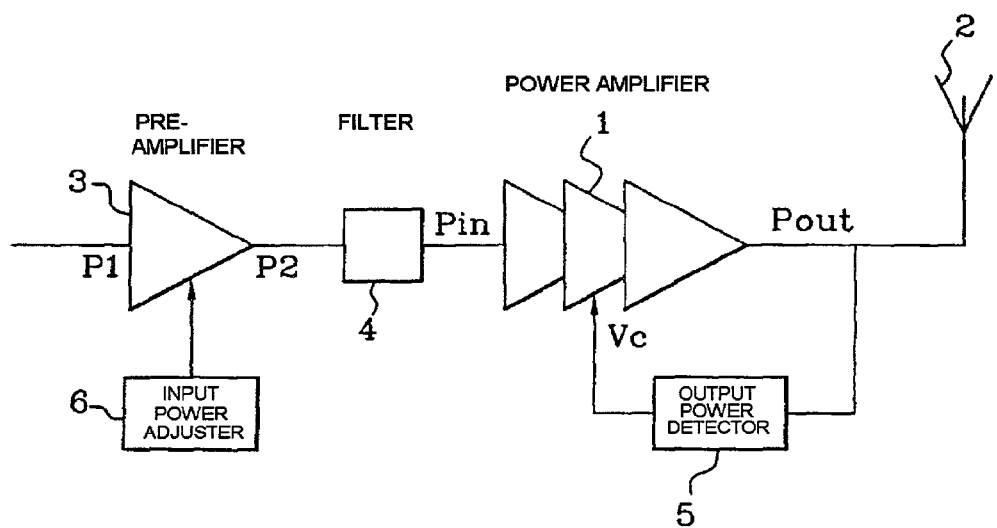
FIG. 2 is a diagrammatic representation of a device for implementing the invention.

FIG. 2 is a diagrammatic representation of a circuit adapted to implement the method of the invention.

The circuit includes a power amplifier 1 receiving an input power Pin and delivering an amplified output power Pout to an antenna 2 transmitting radio signals from the terminal.

The input power Pin comes from a pre-amplifier 3 itself receiving on its input side an input power P1 from a circuit known in the art, not shown. The power pre-amplifier 3 delivers a power P2 which, after passing through a filter 4 that is also known in the art, provides the input power Pin feeding the power amplifier 1.

The device also includes a control loop for the power amplifier 1 including means 5 for detecting the output power Pout and varying the control voltage $V_C$ of the power amplifier 1.

The means 5, which are known in the art, vary the output power Pout by varying the level of the control voltage $V_C$ for constant input power Pin.

The circuit further includes means 6 for varying the input power Pin of the power amplifier 1.

The means 6 are adapted to reduce the output power P2 and therefore the input power Pin in accordance with the necessary output power level Pout by acting directly on the power pre-amplifier 3.

To this end, the power pre-amplifier 3 can be a variable gain power pre-amplifier, for example. In a different embodiment the means 6 for controlling and varying the input power Pin can also include a variable attenuator for varying the input power P1 of the power pre-amplifier 3. A variable attenuator is an attenuator whose voltage and current are controlled so that it has a variable attenuation value. Accordingly, below a predetermined output power Pout programmed in the control means 6, for example, the input power Pin of the heterojunction bipolar transistor power amplifier 1 is reduced so that the control voltage $V_C$ of the power amplifier 1 can be increased.

Above the predetermined value of the output power Pout, the device continues to operate in accordance with the method described with reference to the prior art. Accordingly, for sufficiently high values of the output power Pout, the level of the output power Pout is controlled only by the means 5 for varying the control voltage $V_C$.

The invention makes it possible to use heterojunction bipolar transistor power amplifiers, whose compactness and efficiency are significantly improved compared to those of power amplifiers using other technologies, in a zero intermediate frequency architecture.

Moreover, the operating time between changing or charging the battery of a radiocommunication terminal equipped with the above kind of device using the method according to the invention is greatly increased, being in direct relation to the power demand of the power amplifier 1 of the terminal.

There is claimed:

1. A method of controlling the power delivered by a heterojunction bipolar transistor power amplifier receiving an input power and delivering an amplified output power in a zero intermediate frequency architecture, said method including a step of detecting said output power and varying a control voltage of said power amplifier by means of a control loop to vary the gain of the amplifier, and a step of varying said input power level of said power amplifier, wherein, long as said output power is greater than a first predetermined limit value, said input power is kept constant and the control voltage is varied to obtain a non-linear said gain, and wherein, only when said output power is less than said first predetermined limit value, said input power is reduced, for the same output power, to a value causing said control voltage to be increased to a second predetermined value where the power amplifier has only a linear said gain.

2. A circuit for controlling the power emitted by a heterojunction bipolar transistor power amplifier receiving an input power and delivering an amplified output power in a zero intermediate frequency architecture, said circuit including first means, for detecting said output power and varying a control voltage, and thus the gain, of said power amplifier, and second means for varying said input power of said power amplifier, wherein, as long as said output power is greater than a first predetermined limit value, said second means maintains constant said input power, and said first means varies said control voltage to obtain a non-linear said gain, and wherein, only when said output power is less than said first predetermined limit value, said second means reduces said input power, for the same output power, to a value causing said control voltage to be increased to a second predetermined value where said power amplifier has only a linear said gain.

3. The circuit claimed in claim 2 including a variable gain pre-amplifier.

4. The circuit claimed in claim 2 wherein said second means for varying said input power of said power amplifier includes a variable attenuator.

5. A radiocommunication terminal including a power control circuit as claimed in claim 2.

* * * * *